United States Patent [19]
Burger

[11] Patent Number: 4,702,785
[45] Date of Patent: Oct. 27, 1987

[54] PROCESS FOR MANUFACTURING MULTILAYER PC BOARDS

[75] Inventor: Rainer Burger, Niederkassel-Ranzel, Fed. Rep. of Germany

[73] Assignee: President Engineering Corporation, Zurich, Switzerland

[21] Appl. No.: 748,042

[22] Filed: Jun. 24, 1985

[51] Int. Cl.[4] .................. B32B 31/16; B32B 7/04
[52] U.S. Cl. ..................... 156/91; 29/526 A; 29/830; 156/307.7; 174/68.5; 428/901
[58] Field of Search ............... 29/522 A, 526 A, 830; 156/91, 92, 629, 630, 307.3, 307.7; 174/68.5; 428/137, 901

[56] References Cited
U.S. PATENT DOCUMENTS 4,414,741 11/1983 Holt .......................... 174/68.5 X
4,506,442 3/1985 Alzmann et al. .................. 29/830

Primary Examiner—Robert A. Dawson
Attorney, Agent, or Firm—Wenderoth, Lind & Ponack

[57] ABSTRACT

A process for manufacturing multilayer printed circuit boards having conductive patterns located in three planes by assembling a stack of laminate layers with at least one prepreg between adjacent laminate layers, the laminate layers having holes around a periphery thereof for aligning the laminate layers with respect to each other. Then, the stack of laminate layers and prepregs are secured together with fastening elements, such as rivets, which deform the outermost laminate layers towards each other such that the outermost ends of the fastening elements are spaced a distance apart less than the maximum thickness of the stack. Finally, the stack of fastened laminate layers and prepregs is subjected to heat and pressure during a curing step which may follow or precede the securing step.

16 Claims, 4 Drawing Figures

PROCESS FOR MANUFACTURING MULTILAYER PC BOARDS

BACKGROUND OF THE INVENTION

1. Field of the Invention

The invention relates to a process for the manufacture of multilayer pc boards having conductive patterns located in at least three planes, in which at least two laminates, superimposed upon each other and separated by at least one prepreg, are aligned relative to one another by means of a register-hole system with which the laminates are provided in their peripheral zones, said laminated structure being subjected to the curing process under heat and pressure.

The invention also relates to a special laminated structure which is produced by this process and which constitutes an intermediate stage during the manufacture of multilayer pc boards incorporating the invention, as well as the use of same in the aforesaid manufacturing process.

"Multilayer pc boards" (multilayers) are understood to mean a laminated structure comprising two or more laminate layers, e.g. thin mold mats impregnated with epoxy glass (thin laminates), each having one or two etched conductive patterns separated by prepregs, e.g. mold mats impregnated with epoxy glass advanced in cure only through the so-called B-stage, said laminated structure being bonded together into one unit by curing in a press under heat and pressure.

Multilayer pc boards of this kind are used in professional electronics.

2. DESCRIPTION OF THE PRIOR ART

In a prior art process for fabricating multilayer pc boards, the proper arrangement of the laminates, and therefore of the conductive patterns, as well as the compression molding together with the prepregs under heat and pressure, are carried out in a single operation. To accomplish this, the compression molds are provided with dowel pins on which the laminates are placed with their register holes, whereupon the laminated structures thusly secured in position in the compression molds are subjected to the molding operation in the press. In this so-called pin-lamination process, it is a disadvantage that, like the laminates, the compression molds and all the auxiliary equipment, such as pressing plates, pressing cushions and foil insulants, must also be provided with register holes for the dowel pins, which entails considerable expense. In addition, the compression molds reduce the useful holding capacity of the press and increase the amount of heat required for the curing. Another drawback is that for the manufacture of multilayer pc boards having different sizes, one must make and keep on hand appropriately matched molds, including the aforementioned auxiliary equipment, or in the case of a standard mold matched to the pressing die, more material will be wasted because of the low level of utilization. In both instances, the cost of the product will be considerably increased.

SUMMARY OF THE INVENTION

Unlike the manufacturing process described above, the primary objest of the invention is to provide a process for manufacturing multilayer pc boards that permits an inexpensive and flexible production in accordance with modern methods while maintaining the high degree of precision, particularly the positional accuracy, of the laminate layers and, hence, of the conductive patterns.

In a process comprising the above production steps, this object is achieved by fastening together, the stack of laminate layers means of mechanical fastening elements so that the laminates are fixed relative to one another subsequent to assembling the stack but prior to the curing operation.

Therefore, the invention is based on the fundamental concept according to which the laminated structure comprising laminate layers and prepregs is bonded together before the curing operation in an intermediate step of the overall manufacturing process under heat and pressure to form a unit, a kind of semifinished or intermediate product, in which the laminates, and hence their conductive patterns, are fixed permanently and securely relative to each other with the required degree of precision. These units can be handled without any special precautionary measures and, when the need arises, they can be stored temporarily before being subjected to the final bonding process, that is, the curing under pressure and heat.

This completely avoids the approach taken in the prior art manufacturing process in which, as described earlier, both the positioning and assembly of the stack of the laminate layers and the molding thereof with the prepregs, take place in compression molds provided with dowel pins.

In the process of the present invention, a displacement of the laminates, and hence of the conductive patterns, during the curing under pressure is prevented with a high degree of reliability, because, in accordance with the main features of the invention, the fastening elements securely fix the laminate layers relative to one another and also hold the separating prepregs in position with an adequate degree of accuracy.

Furthermore, in a particularly preferred embodiment, the laminate layers are superimposed upon each other with confronting surfaces in contact with each other in the area of the fastening elements, so that a flowing of the prepregs during the compression molding will have no effect on the positioning of the laminates.

In order to achieve this contact between confronting surfaces, at least the outermost laminate layers are appropriately deformed towards each other in the peripheral zones thereof outside the prepregs by the fastening elements, for which purpose the prepregs separating the abutting laminates are configured appropriately. In a first embodiment, the prepregs can have in their peripheral zones, in the area of the fastening elements, cutouts that permit a contact between the confronting faces of the abutting laminate layers as a result of their deformation towards each other. Thus, it is possible to make the useful area of the multilayers as large as possible, taking into account the residual flow time of the prepregs. According to another embodiment, the areas defined by the peripheral edges of the prepregs are smaller than the area defined by the register-hole system. In this embodiment, the prepregs are therefore simply cut to a rectangular shape, so that they can be made inexpensively with conventional tools.

When the units prefixed in accordance with the invention are finally molded in a mechanical device, e.g. a hydraulically or pneumatically actuated press, care must be exercised to ensure that during these production steps no pressure is applied to the fastening elements, so that the mechanical fastening elements, even during the pressing operation, fix the position of the laminate layers relative to one another with a high degree of reliability. According to the first version this can be achieved by fastening together the laminate layers in a stack means of the fastening elements which are deformed such that their end surfaces are spaced a distance apart which is less than the maximum thickness of the stack whereby the end surfaces of the fastening elements are set back relative to the outer surfaces of the fixed laminated structure such that the press will not apply pressure to the fastening elements, but instead applies pressure solely to the laminated structure in the area of the prepregs. Therefore, the fastening elements can be positioned between the pressing plates of the press without any difficulty.

However, according to another version, it is also possible to arrange the fastening elements in such a way that they are spaced laterally away from the peripheral edges of the pressing plates and thus lie outside the pressing plates, so that during the molding in the press no pressure is applied to the fastening elements, but instead the pressure is applied solely to the laminated structure in the area of the prepregs.

In both cases, the units comprising a plurality of stacks of laminate layers and prepregs, prefixed in accordance with the invention and freely arranged one above the other and/or side by side with the peripheral edges of th stacks facing one another on the pressing plates, can be molded in a stationary press during the curing operation. Thus, compared to the pin-lamination process there is the advantage that no compression molds are required and that, due to their elimination, better use can be made of the capacity of the presses. In this way, stationary presses are also suitable for the rational production of multilayer pc boards.

Advantageously, the units or stacks prefixed in accordance with the invention can be molded in a twin-band press to enable continuous production of multilayer pc boards.

Finally, tthe units prefixed in the manner taught by the invention permit the curing process to be carried out in vacuo or under hydraulic or pneumatic pressure. Thus, they render possible the application of new technologies for the curing process that are already available or may become available as part of a production on an industrial scale.

According to a fundamental process for fabricating the units prefixed in accordance with the invention, both the positioning of the laminates and the fixing thereof relative to one another are carried out by use of the mechanical fastening elements. For this purpose, suitable fastening elements are passed with an adequately accurate fit through at least two aligned register holes in the superimposed laminate layers so as to enable a simultaneous positional alignment of the laminate layers on the one hand and their fixation relative to one another, on the other.

Rivets, i.e. tubular or plate rivets, preferably made of aluminum or aluminum alloy, are especially suitable as fastening elements of this kind. Rivets are particularly well suited, since they are inexpensive and can be installed with simple tools. However, bolted joints of steel of plastics may likewise be considered.

According to another process for fabricating the units prefixed in accordance with the invention, the laminate layers are positioned by means of a dowel-pin arrangement in an auxiliary device, and the mechanical fastening elements are mounted on the unit to be joined only after the laminates have been bonded together in order to prefix the same for further processing. After the mounting of the fastening elements, the fixed units can be removed from the dowel pins in the auxiliary device and can be handled freely for intermediate storage or delivered for further processing.

Alternatively, staple connectors can be considered for this method of fabricating the prefixed units. Metal staples can be used for this purpose. In this case, the laminate layers provided with the conductive patterns are properly aligned relative to one another by means of dowel pins. Then, the staples are driven through the peripheral zones of the laminate layers in order to fix the same and, in some cases, to bring about the material fit. The dowel pins, which only serve for the fixing of the assembly, can then be removed.

Advantageously, the units prefixed in accordance with the invention can also be used in combination with the mass-lamination process. This process is designed for manufacturing in one pressing operation multilayer pc boards with conductive patterns arranged in at least three and, at the most, four planes. But, unlike the pin-lamination process, adjacent laminate layers each of which has a conductive pattern facing one side of one or more prepregs and the outermost laminate layers having an external metal foil without dowel pins between the pressing plates, is subjected to the curing process. The allocation or positioning of the internal conductive patterns is effected by means of a so-called in-house register-hole system or optically detectable crosshairs.

If circuit boards with conductive patterns lying in more than four planes are required, then in the mass-lamination process not more than two additional conductor planes can be applied in an additional operation. But this calls for an additional curing operation and increases the cost of the product, because the output of a given press capacity is halved due to the two pressing operations.

In the mass-lamination process of the present invention, this disadvantage is overcome by using, instead of a laminate with a maximum of two conductive patterns as internal layers, a unit having several conductive patterns and prefixed in accordance with the invention, said unit being expanded by two additional conductor planes in one curing operation by the combination with the mass-lamination process.

After the molding, the projecting metal foils on both sides in the areas not bonded with the associated prepregs can be removed in manner known from the prior art, so that once more free access can be gained to the register-hole system of the internal laminates for further processing.

Thus, by combining the two processes, it is economically feasible to produce in one curing operation high-precision circuit boards with more than four conductor planes.

Therefore, the intermediate stage taught by the invention, in the form of a fixed laminated structure, results in a number of important and surprising advantages.

Furthermore, the invention is concerned with a laminated structure which is prefixed in accordance with the above-described process incorporating the invention and is only then subjected to the pressing operation. This semifinished produce, e.g. product fabricated in an intermediate stae, enables one to achieve the advantages described earlier. Finally, the invention relates to the use of the fixed units for the manufacture of multilayers.

BRIEF DESCRIPTION OF THE DRAWINGS

The process of the invention and the unit that can be manufactured and prefixed therewith and which is only then subjected to the further processing, particularly the pressing operation, will be described below with reference to the following examples and to the accompanying drawings, in which.

DETAILED DESCRIPTION OF THE PREFERRED EMBODIMENTS

Figure 1:
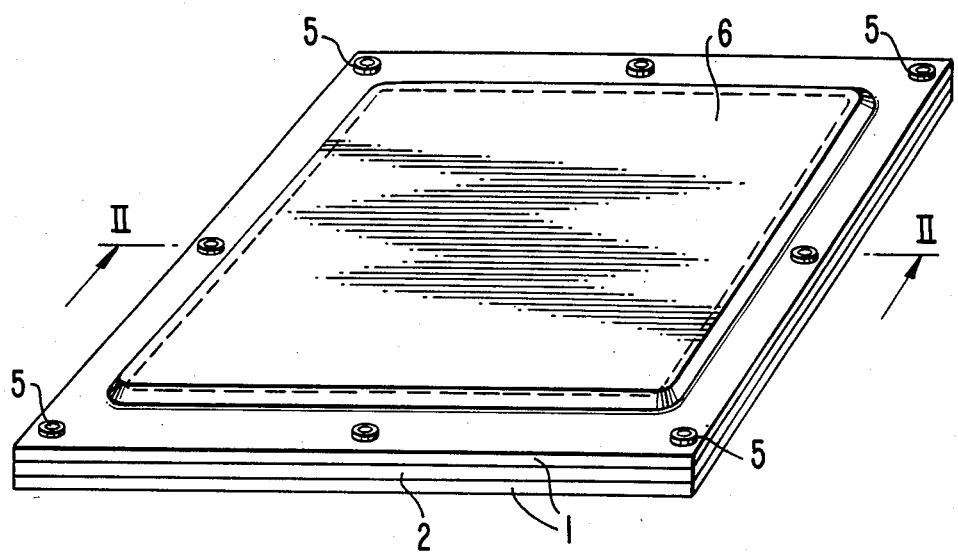
FIG. 1 is a perspective view of a laminated structure prefixed according to the teachings of the invention.
Figure 2:
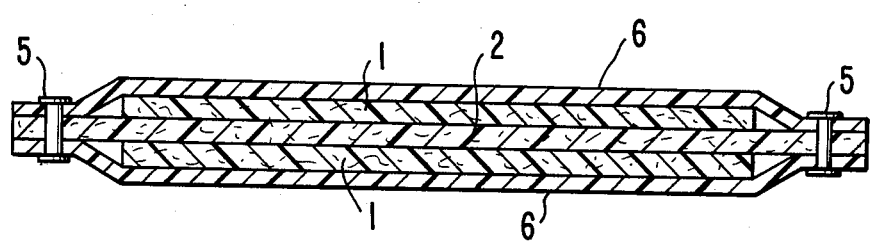
FIG. 2 is a cross-sectional view of the arrangement shown in FIG. 1.

FIGS. 1 and 2 show the construction of a prefixed laminated structure incorporating the invention, as well as the process for manufacturing the same. With the aid of a predetermined register-hole system, one or more inner laminate layers 2 provided with prefabricated conductive patterns on both sides thereof are bonded together and to metal foil covered outer laminate layers1 by fastening means, such as rivets 5, with prepregs 3 (layers of adhesive) separating the outer layers 1 from the inner layers 2. The prepregs 3, required as electrical insulation and adhesive, are cut out around the individual rivets so that the confronting inner surfaces of all layers 2 and outer layers 1 in the area of the rivets are in physical contact with each other, whereby the opposite, outermost surfaces of the peripheral edges of the outer layers 1 are disposed inwardly of planes which contain the opposite, external surfaces of the laminated structure. Thus, the layers 1 and 2, and hence the connecting points to be provided later, are fixed such as to be congruent with one another for the plating-through of the multilayer pc board.

Figure 3:
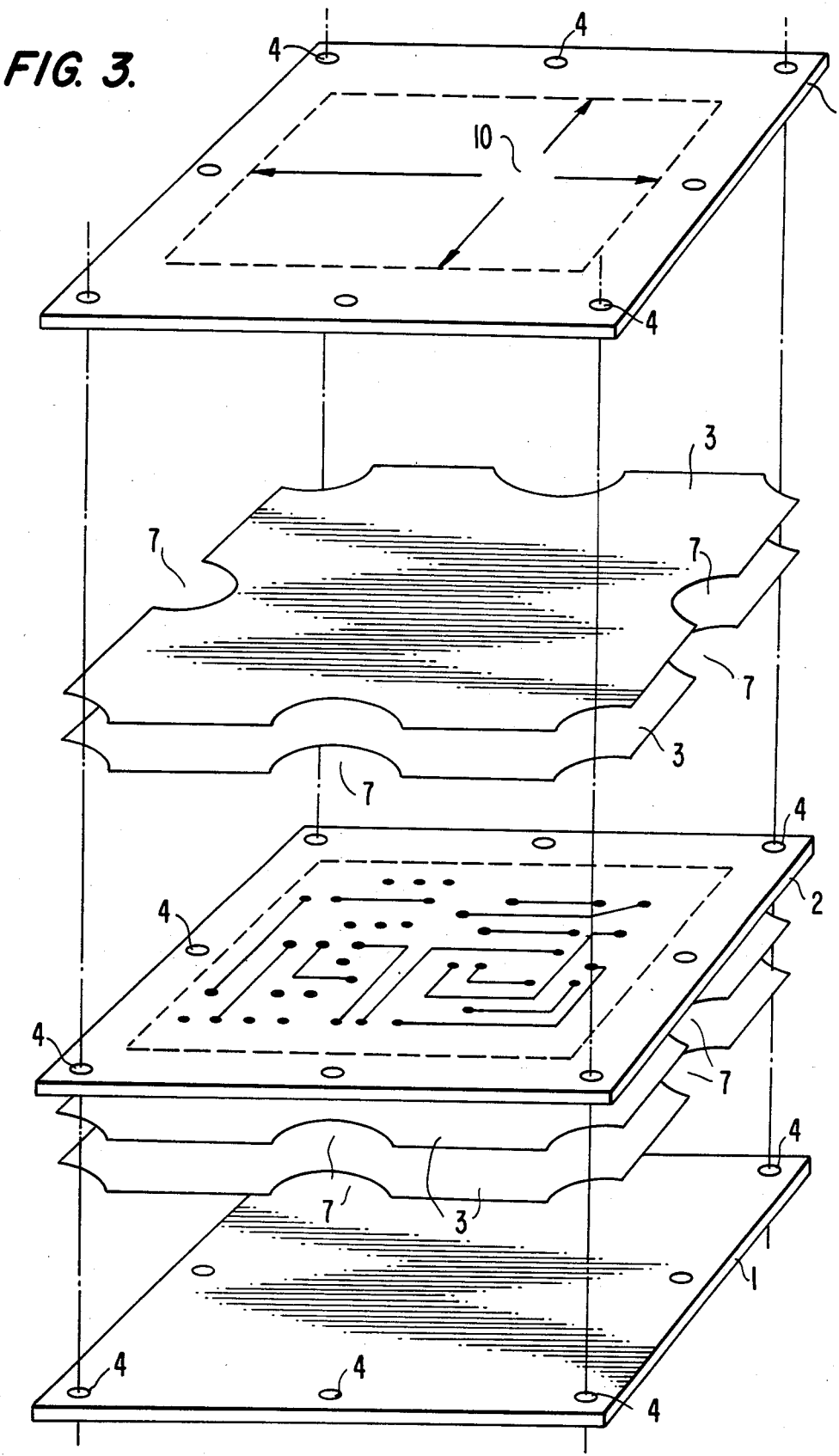
FIG. 3 is an exploded perspectivew view of a laminated structure with prepregs and with recesses.
Figure 4:
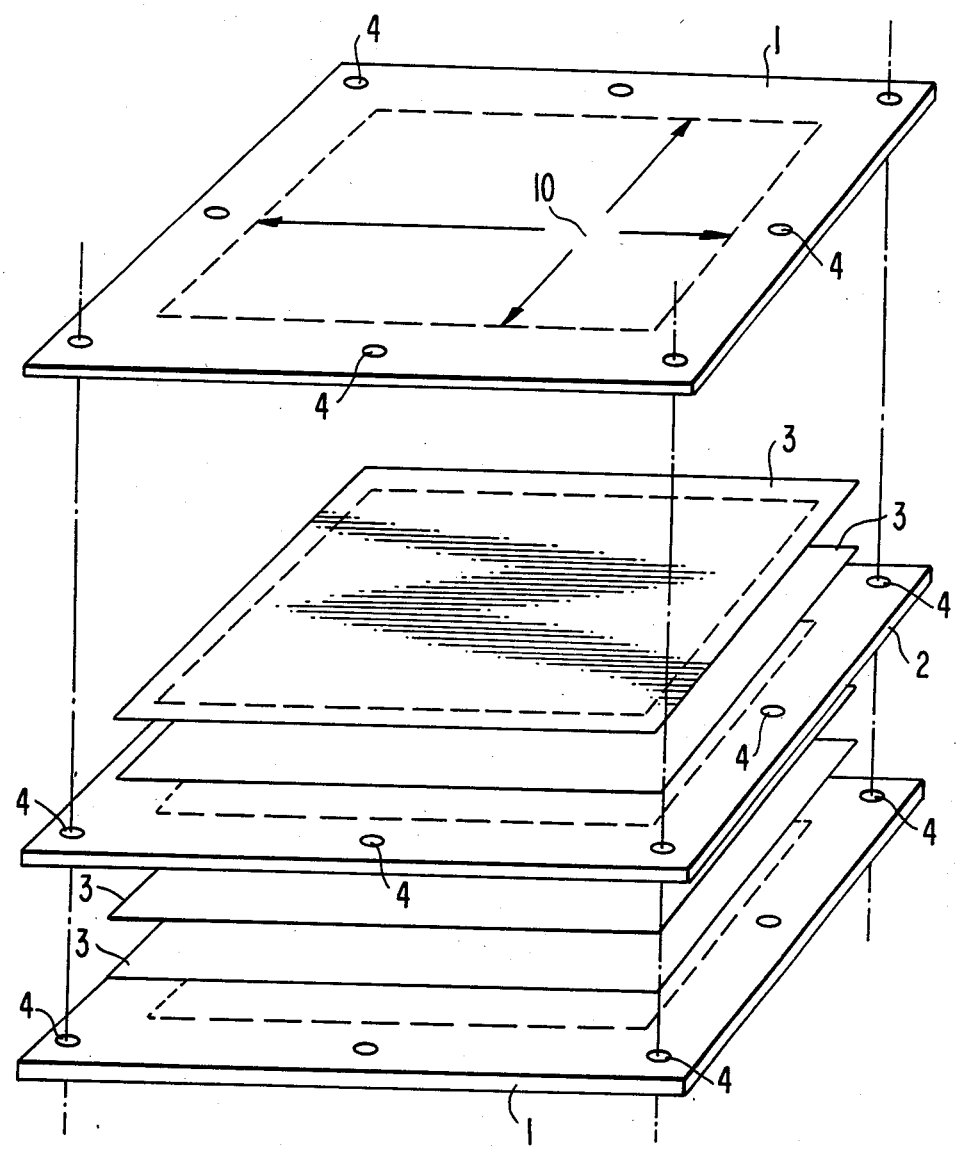
FIG. 4 is an exploded perspective view of a laminated structure with prepregs and having a size smaller than the area defined by the register-hole system.

FIGS. 3 and 4 show two possible versions of the prepregs 3 required for this process. As mentioned earlier, care has been taken to ensure that the layers 1 and 2, at least in the area of the rivets 5, lie against one another with the prepregs therebetween. To this end, as apparent from FIG. 3, the prepregs 3, which obviously can be of a size larger than the subsequent end size 10 of the multilayers, have cutouts 7 at least in the area of register holes 4 which are to be filled with the rivets 5, so that the abutting surfaces of the layers 1, 2 can be in contact with each other in the area of the rivet joints. As shown in FIG. 4, the size of the prepregs 3 can be larger than the end size 10 of the multilayers, but smaller than the area defined by the register-hole system 4. While in the embodiment depicted in FIG. 3 the useful area of the multilayers has its maximum size, in the embodiment of FIG. 4 there is good economy of prepreg material.

It the units prefixed in accordance with the invention are to be molded in a hydraulic press in layers superimposed upon each other, obviously without the use of the compression molds required in the pin-lamination process, care must be taken to ensure that the rivets 5 are not subjected to any pressure load. To this end, as can best be seen in FIG. 2, the outer layers 1 are fastened together by the rivets 5 to the inner layers 2, so that the end surfaces of the rivets 5 are properly set back in relation to the external surfaces 6 of the laminated structure. The result is that during the pressing operation the molding pressure is effective only on the prepreg surfaces and that during the pressing the lower-lying rivets are not subjected to any pressure load. In this way, the rivets 5 and the bonding together of the layers 1, 2 with the surfaces thereof in contact with each other ensure a positionally accurate fixing even during the pressing operation, resulting in multilayer pc boards with an extremely high positional accuracy.

In order to ensure an accurate, previously determined positioning of a drill in relation to the electrical connection points, appropriate locating holes must be drilled in the compression-molded multilayers. These locating holes can be drilled in various ways known per se. In all cases, they must be accurately positioned in relation to the conductive pattern of the inner layers 2. Excellent positioning is achieved by using, for the purpose of locating on the automatic drill the existing register holes in the laminates 1, 2 which are not filled with rivets 5. If register holes 4 filled with rivets 5 are to be used, the rivets 5 can be subjected to a chemical etching process in order to remove them. While the present invention has been described with reference to the foregoing embodiments, it will be apparent to those skilled in the art that various modifications thereof may be employed without departing from the spirit of the invention or scope of the appended claims.

I claim:

1. A process for the manufacture of multilayer printed circuit boards having conductive patterns located in at least three planes, comprising:

assembling at least one stack of at least two laminate layers each of which is separated from each adjacent laminate layer by at least one prepreg to form a stack having a maximum thickness in a direction perpendicular to said planes, said laminate layers each having means disposed in an area thereof for aligning said laminate layers with respect to each other;

securing said stack of laminate layers and said at least one prepreg together with fastening means located in said area of each adjacent laminate layer, said fastening means extending a distance in said direction which is less than said thickness of said stack; and curing said stack of laminate layers and said at least one prepreg by application of heat and pressure thereto.

2. A process for the manufacture of multilayer printed circuit boards having conductive patterns located in at least three planes, comprising:

assembling at least one stack of at least two laminate layers each of which is separated from each adjacent laminate layer by at least one prepreg, said laminate layers each having means disposed in an area thereof for aligning said laminate layers with respect to each other;

securing said stack of lainate layers and said at least one prepreg together with fastening means located in said area of each adjacent laminate layer to deform outer-most layers of said stack towards each other in a portion thereof adjacent said fastening means; and curing said stack of laminate layers and said at least one prepreg by application of heat and pressure thereto.

3. A process for the manufacture of multilayer printed circuit boards having conductive patterns located in at least three planes, comprising:

assembly at least one stack of at least two laminate layers each of which is separated from each adjacent laminate layer by at least one prepreg, said laminate layers each having means disposed in an area adjacent a periphery thereof for aligning said laminate layers with respect to each other, and each of said laminate layers being separated from each adjacent laminate layer by a gap located between said area of each adjacent laminate layer;

securing said stack of laminate layers and said least one prepreg together with fastening means located in said area of each adjacent laminate layer to hold confronting surfaces of adjacent laminate layers in contact with each other; and curing said stack of laminate layers and said at least one prepreg by application of heat and pressure thereto.

4. The process of either claim 1, 2 or 3, wherein said at least one prepreg includes at least one cutout in a portion thereof which is aligned with said area of each adjacent laminate layer at which said fastening means is located, whereby said confronting surfaces of said adjacent laminate layers are brought into contact with each other during said securing step at least in said area of each adjacent laminate layer.

5. The process of either claim 1, 2 or 3, wherein said aligning means comprises a plurality of register holes in each of said laminate layers, said register holes defining an area which is larger than the area defined by the peripheral edges of said at least one prepreg, whereby said confronting surfaces of said adjacent laminate layers are brought into contact with each other during said securing step at least in said area of each adjacent laminate layer.

6. The process of either claim 1, 2 or 3, wherein said curing step includes applying pressure by means of a press to said stack without applying pressure to said fastening means.

7. The process of either claim 1, 2 or 3, wherein said fastening means comprises at least one mechanical fastening element fitted through aligned holes in said laminate layers by which said laminate layers are positioned relative to each other and are fixed relative to each other.

8. The process of either claim 1, 2 or 3, wherein said fastening means comprises a plurality of mechanical fastening elements fitted through aligned holes in said laminate layers by which said laminate layers are positioned relative to each other and are fixed relative to each other.

9. The process of claim 7, wherein said fastening element is a rivet.

10. The process of claim 8, wherein said fastening elements are rivets.

11. The process of either claim 1, 2 or 3, wherein said stack is assembled on an auxiliary device having dowel pins for positioning said laminate layers with respect to each other and said step of securing said fastening means is performed while said stack is held in position by said dowels of said auxiliary device.

12. The process of either claim 1, 2 or 3, wherein a plurality of stacks are assembled during said assembling step and said plurality of stacks are arranged one above the other and pressed together during said curing step.

13. The process of either claim 1, 2 or 3, wherein a plurality of stacks are assembled during said assembling step and said plurality of stacks are arranged in side-by-side relationship with the peripheral edges of said stacks facing one another during said curing step.

14. The process of either claim 1, 2 or 3, wherein a plurality of stacks are assembled during said assembling step and a twin-band press is used to apply pressure to said stacks as they are fed continuously to said twin-band press during said curing operation.

15. The process of either claim 1, 2 or 3, wherein said curing step is performed after said assembling step but prior to said securing step.

16. The process of either claim 1, 2 or 3, wherein said curing step is performed subsequent to said assembling and securing steps.

* * * * *